CONDUCTING ELEMENT HAVING IMPROVED BONDING CHARACTERISTICS AND METHOD

Filed Sept. 18, 1961 2 Sheets-Sheet 1

INVENTORS.
MILTON L. SELKER
BETTY M. LUCE
BY
Schramm, Kramer & Sturges
ATTORNEYS.

INVENTORS.
MILTON L. SELKER
BETTY M. LUCE
BY
ATTORNEYS.

3,293,109

CONDUCTING ELEMENT HAVING IMPROVED BONDING CHARACTERISTICS AND METHOD

Betty M. Luce, Willowick, and Milton L. Selker, Shaker Heights, Ohio, assignors to Clevite Corporation, a corporation of Ohio Filed Sept. 18, 1961, Ser. No. 138,881
14 Claims. (Cl. 161—166)

This invention relates to improvements in the surface of a conductive metal to enhance its ability to adhere to a resinous material, and to the method for improving such surface. More particularly, this invention relates to improved electrical conducting elements and composite laminar structure, such as a printed circuit, employing improved copper bodies of the present invention in laminar relation with a plastic backing.

The principles of this invention are particularly useful in connection with printed circuits, and for this reason will be discussed in connection with this end use, it being understood, however, that the invention is not limited to such end use, since such treatment may be used for example to provide copper bodies having improved retentive characteristics for enamel coatings, e.g., enameled copper wire.

Printed circuits are well known and widely used in various electronic devices, such as radios, television, electronic computers, etc. The electrical conductors thereof are frequently made of copper foil which is adhered to a resinous substrate having a high dielectric strength. Reinforcing means, such as glass fiber, paper webs, etc., may be disposed within the resinous body to improve the strength of the material. Adhesion of the conducting element to the non-conducting substrate is effected by a suitable resinous material generally characterized by high functionality and high resistivity. Even with the development of improved substrates, and/or adhesives therefor, adhesion of copper foil to resinous substrates has not been wholly satisfactory. Experience has shown, however, that adhesion can be improved only at the sacrifice of high resistivity in the resinous substrate or the adhesive employed therewith. As is well understood, copper foil for use in printed circuits is generally adhered under heat and pressure to a thermoplastic substrate which under such conditions becomes thermosetting. Typical examples of substrates include the epoxy resins and the phenol-nitrile resins.

Briefly, in accordance with this invention, we have found that the surface of a copper body of any configuration, and particularly a copper body in the form of copper foil, either rolled or electrodeposited, can be greatly improved in respect of its adhesivity, i.e., its ability to be adhered, by providing thereon a surmounting strata of copper-copper oxide particles deposited in random clusters to form a plurality of projections from said substrate configured to increase the surface area of the supporting copper metal substrate. A coating of metallic copper coacts in surmounting and intimate secure relation with the first strata as an encapsulating coating to maintain the desired configuration of the surface projections intact. The particle clusters and the encapsulating coating are preferably applied by electrodeposition and the resulting surface has adhesive characteristics which are greatly improved over those heretofore obtainable with copper in combination with a resinous substrate.

We have found that in the process of electroplating or electrodepositing copper from a sulphuric acid-copper sulphate solution, for example, where excessive current densities are employed, and depending upon the concentration of other ions, such as halide ions, in the plating bath, the material which is plated from the solution on the surface of the copper body exposed thereto is a lightly adhering powder of copper which is partially oxidized. This is identified throughout this specification and in the appended claims as a copper-copper oxide material. Under the conditions of electroplating hereinafter more particularly described, these particles pile up in random clusters on the surface of the copper to form projections of desired configuration from the surface thereof. If the conditions of the electroplating are then returned to normal conditions, i.e., a much lower current density such as that normally used in depositing sound copper films, there is then deposited over the copper-copper oxide projections an encapsulating coating of copper metal which serves to maintain the desired projection configuration on the copper substrate.

The surface configuration obtained by this process appears under high magnification to be highly irregular and characterized by knobbed projections from the surface. Thus, not only is the exposed surface area greatly increased, improving adhesion, but also because of the knobbed structure, the mechanical aspects of adhesion are also enhanced.

Throughout this specification, reference will be had to the property "adhesivity" which signifies the ability of a body to be adhered to another independent body.

Figure 1:
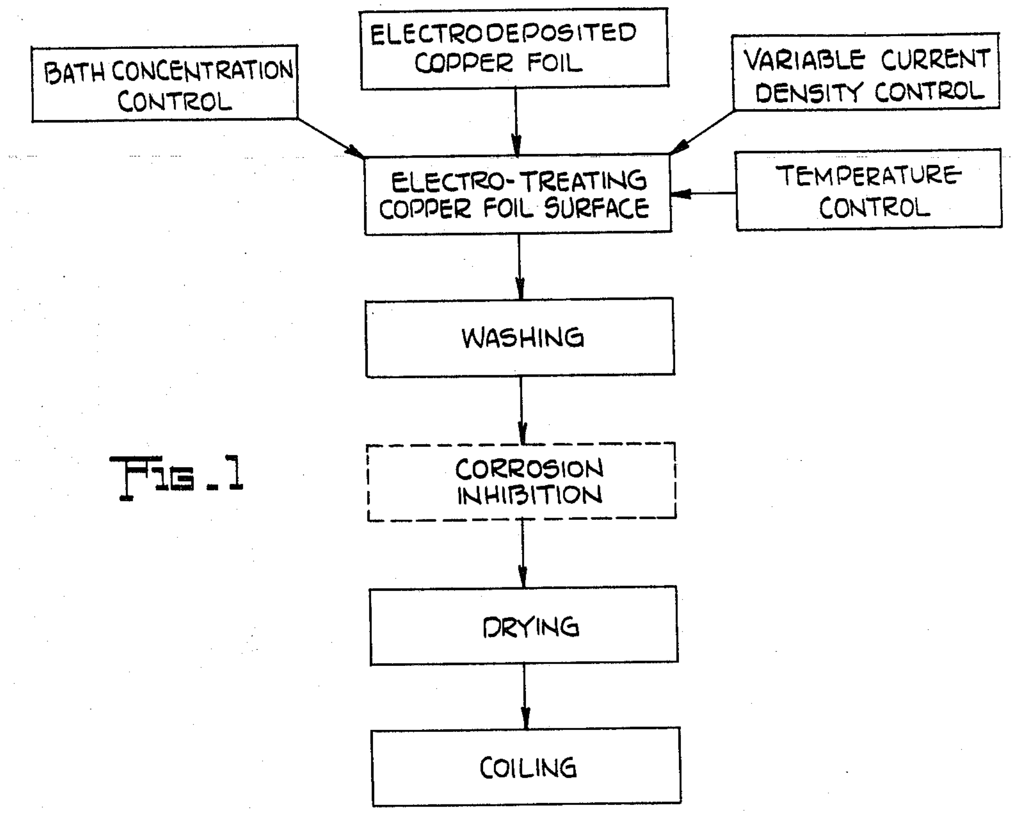
FIG. 1 is a flow sheet of process for producing the improved surfaces on copper bodies in accordance with the present invention.

Referring now more particularly to the drawings, FIG. 1 shows a flow sheet of the process utilized in treating an electrodeposited copper foil. Instead of electrodeposited copper foil, there may also be used rolled foil, or copper sheets, bars, rods, wires, etc. According to this process, the copper body is submitted to an electrolytic process by which the surface is treated. Variable current density control is provided along with temperature control and concentration of the ingredients in the electroplating bath. Following the surface treatment, the foil or copper body is washed to remove excess electrolyte therefrom, and optionally a corrosion inhibition step may be followed. Thereafter the copper body is dried, and if foil has been used as a starting material, the foil is then coiled for delivery or use. If the copper body is to be stored, transshipped, and exposed to air, treatment with the corrosion inhibitor, such as the sodium salt of 1,2-benzotriazole, will aid in the preservation of the surface.

Figures 2, 3:
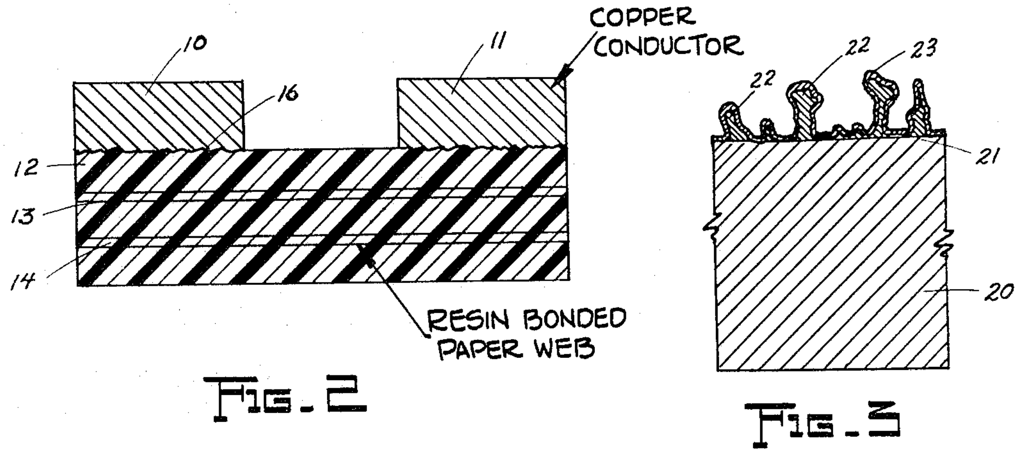
FIG. 2 is an enlarged cross-sectional view of a conducting element of a printed circuit type in accordance herewith.
FIG. 3 is a much enlarged and exaggerated illustration of a cross-sectional portion of a copper body showing the nature of the surface obtained in accordance with a preferred process of the present invention.

FIG. 2 is a cross-sectional view, much enlarged, of a printed circuit element showing two electrical conductor elements 10 and 11, of copper foil produced in accordance herewith. Substrate 12 is a reinforced resinous body having paper webs 13 and 14 disposed therein. The elements 10 and 11 are adhered to the resin bonded substrate 12 by compressing a sheet of copper foil produced in accordance herewith to the surface under conditions of elevated temperature and pressure. Under these conditions the resin becomes plastic and flows, and because of the pressure, fills the indentations and completely covers the irregular surface of the copper body and is firmly bonded thereto. Thereafter, unwanted portions of the circuit may be removed by any convenient process, e.g. etching. The surface of improved adhesivity, 16, is, thus, in contact with the resin 12. The resinous substrate 12 may be any resinous material currently used in the printed circuit art, such as phenol-nitrile, epoxy resins, e.g. epichlorohydrin-2,2'-di-(p-hydroxyphenyl) propylidene condensation product (1:1) having an epoxy equivalence between 1 and 2. Any other high dielectric strength material such as poly (phenol-formaldehyde, vinyl butyral) may be used for this purpose. Alternatively, instead of utilizing the resinous body itself as the adhesive means, a separate adhesive layer may be interposed between the surface of the copper body and the surface of the resinous substrate. Similar adhesive materials such as ethylene diamine cured epoxy resin, or the poly(phenol-formaldehyde, vinyl butyral) resin may be used.

The effectiveness of an adhesive is measured in terms of the force in pounds required to separate a 1-inch wide strip of one ounce metal foil from the resinous substrate when pulled at an angle of 90° to the surface. Heretofore, 5 to 10 pounds per inch has been considered maximum performance at 23° C. We are able to obtain with conventional resinous substrates at 23° C. forces of 15 to 25 pounds per inch without sacrificing the high dielectric strength properties desired.

As indicated above, conventional adhesives may be used to bond copper sheets to a resinous substrate, and improved adhesion due to coaction between the adhesive and the electro-deposited surface will be found. For electrical purposes, high dielectric strength adhesives are selected. Among these are the various thermosetting and thermoplastic polymers and copolymers, and mixtures thereof. A particularly satisfactory adhesive is composed of phenol-formaldehyde condensate, and butadiene-acrylonitrile rubber in a ratio of 90:10 and having 100 parts of wood flour admixed therewith. This is a phenolic-nitrile adhesive currently used in the metal-non-metal adhesive field, particularly in printed circuits. Another adhesive currently used is a mixed poly(vinyl butyral)-(phenol-formaldehyde). Epoxy resins cured with various polyamine hardening agents are also used to adhere metals to metals and are characterized by very satisfactory conductivity characteristics. Various alkyd resins, which are polyesters, may also be used as adhesives, for example, a maleic anhydride-ethylene glycol polyester. Such polyesters dissolved in styrene, and copolymerized in place under heat with the addition of a small amount of a peroxide initiator provide excellent adhesives.

FIG. 3 shows a much enlarged pictorial cross-sectional representation of a copper body 20, the upper surface of which 21 has been treated in accordance herewith. There are shown a number of projections 22 having an inner core of copper-copper-oxide. In surmounting relationship therewith is an exterior coating 23 of copper metal which serves to secure the projections 22 to the surface 21 of the copper body 20. When a cross-section of an actual copper body is observed under several hundred diameters magnification, structure similar to that shown in FIG. 3 is obtained and is characterized by a plurality of knobbed projections 22 such as those depicted in FIG. 3.

Figure 4:
FIG. 4 is a photographic reproduction of an electron-micrograph showing the improved surface of a copper body of the present invention.

FIG. 4 is a photographic reproduction of an electron micrograph under a magnification of 6,000 diameters showing a top elevation of a surface of a copper body treated in accordance with the process of the present invention.

It becomes convenient at this point to illustrate this invention by the provision of specific examples. It is to be understood, however, that these examples are for illustrative purposes only and not to be construed as limiting the invention to the precise scope thereof.

*Example I*

A one ounce electroplated copper foil produced by a commercial electrolytic procedure was treated in accordance with the present invention. One such commercial electrolytic procedure for producing copper foil utilizes an electrolyte composed of a solution of copper sulphate and sulphuric acid in water. Copper is present within the range of from 45 to 55 grams per liter calculated as the metal, and the sulphuric acid content, calculated as 100% $H_2SO_4$, is within the range of from 90 to 110 grams per liter. In addition to these principal ingredients, a proteinaceous material, such as animal hide glue to control the nature of the deposition, is present in an amount maintained preferably between 2 to 3 p.p.m. Lignin sulphite is also added to the solution in a similar amount. The replenishment of glue and lignin sulphite is regulated by visual examination of the surface of the copper foil under a microscope. The temperature of the foil producing bath is maintained at 108° F.±2°, and the current density maintained at the highest level consistent with the production of good quality foil. A suitable current density has been found to be 160 amperes per square foot with vigorous agitation of the bath.

While ordinary electrolytic foil producing techniques contemplate the use of a lead-surface drum, the surface of which is continuously burnished immediately upon stripping of the copper foil therefrom, better results are secured by utilizing a hardened chromium-surfaced drum on which all pits and irregularities have been substantially removed. Such a drum avoids the burnishing required to the lead-coated drum and enables, therefore, the production of a copper foil which is free of lead inclusions. Such copper foil is preferred for use in the production of printed circuits. The etching characteristics of copper are deleteriously affected by the presence of lead inclusions which are unavoidable in the lead drum process.

Substantially pure copper foil produced in the manner aforesaid has an "as plated" surface which is duller than the opposite surface which is exposed to the drum-electrode and has a sheen similar to the appearance of a very fine suede surface.

A one ounce electroplated copper foil produced in accordance with the procedure outlined above was electroplated in a copper sulphate bath containing 200 grams per liter of sulphuric acid. A current density of 100 amperes per square foot was applied for 15 seconds followed by a 5-minute treatment at a current density of 36 amperes per square foot. The temperature of the bath was maintained at 26° C. The plating solution was not agitated.

The peel strength between this treated copper foil and an epoxy-glass cloth laminate was 16–18 pounds per inch. The same peel strength was obtained when the treated copper was laminated to a phenolic-paper base board using a conventional printed circuit adhesive material. When the treated foil was laminated directly to phenolic paper base sheets, the peel strength was 8 pounds per inch. Peel strength between these laminates and untreated foil of the same thickness was 5–7 pounds per inch, 4–6 pounds per inch and 1 pound per inch, respectively.

*Example II*

Using the same plating solution as set forth in Example I, copper foil was produced on a chromium-hardened surface drum at a current density of 36 amperes per square foot and a temperature of 26° C. After a suitable thickness of copper foil had been deposited, the current density was raised to 100 amperes per square foot over a period of 20 seconds, held at 100 amperes per square foot for a period of 10 seconds, and gradually decreased to the original 36 amperes per square foot over a period of 20 seconds. After plating at a current density of 36 amperes per square foot for a period of 4 minutes, the surface was found to be of the same character as that obtained in Example I, and the peel strength of the copper clad laminates was found to be substantially identical with those in Example I.

In general, we may use current densities ranging from 75 to 250 amperes per square foot, for a period ranging from 5 to 50 seconds to form the surface projections. Generally, a lower current density over a longer period is used to provide the encapsulating coating, i.e., 20 to 150 amperes per square foot for from 15 to 600 seconds. The overlap in the current density ranges is occasioned by the fact that in this region both copper plating and copper-oxide formation is occurring.

The current density required for producing the surfaces of the present invention is dependent on the solution concentration, degree of agitation, and operating temperature of the copper sulphate plating bath. For example, if the temperature of the plating solution described above is raised, and agitation is provided, the current density used for the surface conditioning process would have to be raised accordingly. If the copper concentration were lowered or the sulphuric acid concentration increased, the required current density would be lower. Conditioning agents that are used, such as grain refiners, e.g., lignin sulphite, will influence the current density requirements also.

The duration of electrolysis at the high current density is a critical factor. If the time is too short, the character of the surface will be inadequate, i.e., give a lower bond strength; if the treatment time is too long, the powdery deposit will be too thick to be "cemented" to the surface by electroplating at the lower current densities.

If the treatment provided for in accordance with this invention is to be incorporated in a copper foil plating tank where the cathode is a continuously revolving drum of the type previously described, an insoluble anode of lead is placed in close proximity to the drum at a distance sufficient to allow about 10% of the total thickness of the foil to be plated afterward. The current density at this particular point is extremely high. After passing this point, the current density should be returned to normal for the final copper plate.

In the production of printed electrical circuits, copper is very much desired because of its high electrical conductivity. Where the copper foil is carefully made and contains minimum elemental impurities, e.g., lead, selenium, tellurium and phosphorus, the electrical conductivity is also very uniform over the extent of the electrical connection between two points.

The copper foil, as indicated above, may be rolled or electrodeposited. While either surface of electrodeposited or rolled copper foil may be beneficiated in accordance herewith, best results are secured on the "as plated" surface of electrodeposited foil which is characterized by having a columnar grain structure.

As indicated above, any copper surface may be treated in accordance with the teachings of the present invention to provide a copper surface which is more readily adherable to various other surfaces of a resinous nature, such as rigid resinous substrates, flexible resinous substrates, and air drying or baking coatings or enamels. Thus, an electrodeposited copper foil which has been further treated in an electrolytic process to provide a "nodularized" surface thereon may be further treated in accordance herewith to improve the adhesive characteristics of such copper foil. Electrodeposited copper foil is characterized by a grain structure which provides a surface having promontories thereon when viewed under extremely high magnification. These promontories can be rendered highly irregular as compared with the regular "as plated" surface by the provision on the summits and along the ridges of such promontories of nodules. These nodules are integrally connected to the copper grains and may be produced by a separate electrolytic process. The following electrolytic bath is exceptionally well adapted to the formation of the nodules as well as the provision of controllable amounts of copper oxide in the later step. A typical bath has an analysis in accordance with the following:

| | |
|---|---|
| Chloride, p.p.m. | 30–35 |
| Copper (calc. as the metal), grams per liter | 20–25 |
| Sulphuric acid, grams per liter | 65–75 |
| Animal hide glue (low fat), grams per liter | 0.5–1.0 |
| Demineralized water | Balance |

The chloride ion may be derived from any water soluble chloride such as an alkali metal chloride, e.g., sodium chloride, potassium chloride, lithium chloride or ammonium chloride. Instead of chloride ion, we may use any other halogen, such as bromide. The copper content in the bath is provided from copper sulphate. The glue may be replaced with any other dispersible proteinaceous material, and material such as peptone, blood albumen, gelatin, casein, egg albumen, etc. The amount of halogen in this bath is substantially above that which is regarded as good practice in copper plating procedures. However, with respect to this particular step for preparing the desired nodules, the amount of halide ion is critical. The current density for the production of nodules is carefully controlled to be within the range of from 60 to 100 amperes per square foot and the bath temperature of electrodeposition of the nodules is maintained at from 70°–80° F.

In carrying on the electrochemical reaction resulting in the formation of the nodules, it is desired to use an insoluble anode, e.g. a lead plate, which is non-reactive with the bath. The copper foil serves as the cathode. The glue content of the treating bath is maintained between 0.5 and 1.0 gram per liter, 0.7–0.9 gram being optimum. Additions of glue are made on the basis of turbidimetric analyses regularly made each day. The chloride content is maintained between 0.030 and 0.035 gram per liter by additions of sodium chloride also based on turbidimetric analyses. Adjustment of chloride is preferably made twice each eight hours of continuous operation. It is desirable also to circulate the treating bath slowly between the anode and the surface of the copper foil being treated at a rate, however, which is below that which can cause streaking of the surface. Foil travels through the bath at the rate of about 7.5 feet per minute and is exposed to the current for a period of approximately 15 seconds. These conditions, it has been found, are productive of surfaces having substantially a nodularized appearance.

Nodularized copper foil produced in accordance with the preceding process may be further treated in accordance with the present invention to produce a deposit of lightly adhering copper-copper oxide particles on the surface thereof, followed by a "cementing" step whereby copper metal in sound form is cast upon the lightly adhering particles of copper-copper oxide to secure them to the nodularized copper substrate. Greatly improved adhesion of such nodularized-electro-roughened copper is secured.

One class of substrate materials upon which the metallic foil is employed following a predetermined electric circuit desired is currently being made from laminated resin impregnated web, such as, for example, cellulosic or paper webs, or fiberglass webs. A resinous material which is highly satisfactory for this purpose because of its very high dielectric strength characteristics is a chemically hardened epoxy resin, e.g. an alkylene diamene cured condensation product of epichlorohydrin and 2,2'-di-(p-hydroxyphenyl) propylidene having an epoxy equivalence between 1 and 2. The production of ether resins is well known, and those skilled in the resin art are fully acquainted with the various types of ether resins which may be produced and used for the processes mentioned above.

The resinous substrates may be any of a wide variety of polymeric materials. Included among these are the aforementioned epoxy resins, which may be fiberglass or paper reinforced, polymethylmethacrylate, resorcinol-formaldehyde, phenol formaldehyde, poly(vinyl chloride-vinyl acetate), etc. with or without filler materials for reinforcing the resinous body. These materials will be selected in accordance with the end use. For electrical purposes, e.g. printed circuits, we prefer the reinforced epoxy resins. When such resin reinforced with fiberglass has a dielectric strength of 310 volts per mil parallel and 445 volts per mil perpendicular; and a flexure strength of 63,200 p.s.i. The dielectric constant is 5.4. A paper reinforced phenol-formaldehyde, which is also very useful in electrical apparatus, has a dielectric strength of 495 volts per mil parallel and 545/mil perpendicular; and a flexure strength of 18,800 p.s.i. The dielectric constant is 4.8. All measurements are taken on a one-eighth inch thick sample.

The completion of a printed circuit contemplates according to one procedure the adhesion of circuit conforming strips of bare copper foil to a non-metallic substrate of the type above described under heat and pressure, followed by etching to remove unwanted copper portions and leave the circuit conforming copper foil behind. Even with the care exercised in preparing surfaces to aid adhesion of the metallic circuit to the substrate, the problem of securing adhesion is complicated by many factors. Adhesives are known which will bond copper, for example, to laminated epoxy resin impregnated paper substrates with more than adequate adhesion insofar as industrial requirements are concerned. However, these powerful adhesives do not have the proper electrical resistivity properties and hence may not be used in many applications. Alternatively, adhesives which do possess desired electrical properties appear to be deficient in adhesive characteristics.

We have found that the improved surface on the copper body, particularly on copper foil, coacts with a resinous material or an adhesive to provide greatly improved initial and long term adhesion to non-metallic substrate materials.

There has thus been provided an improved copper body characterized by greatly improved adhesivity, or ability to be adhered to other materials, and particularly to resinous substrates, or to have resinous coatings adhered more strongly thereto. It is believed that the improved adhesion is due to the presence of myriad minute projections of desired configuration formed on the surface of the copper body, which projections are characterized by having an inner core of copper-copper oxide particles and a cementing encapsulating coating thereover of sound copper metal.

Other modes of applying the principle of this invention may be employed instead of those specifically set forth above, changes being made as regards the details herein disclosed provided the elements set forth in any of the following claims, or the equivalent of such be employed.

It is, therefore, particularly pointed out and distinctly claimed as the invention:

1. In a copper body having a predermined external surface adapted to be adhered to another independent surface and forming a supporting substrate, a surmounting strata of copper-copper oxide particles deposited in random clusters to form a plurality of projections from said substrate and thereby establish an irregular surface on the supporting substrate, and a subsequently applied sound metallic copper coacting in surmounting and intimate secure relation with said surmounting strata to provide an encapsulating coating adapted to maintain said surface projections intact thereon.

2. The copper body of claim 1 which the predetermined external surface has projections randomly extending therefrom to provide a first irregular surface.

3. The copper body of claim 2 in which the predetermined external surface has projections randomly extending therefrom to provide a first irregular surface and said clusters are deposited substantially on said projections.

4. A copper foil having an external surface adapted to be adhered to a resinous surface and forming a supporting substrate, a surmounting strata of copper-copper oxide particles deposited in random clusters to form a plurality of projections from said foil surface and thereby establish an irregular surface thereon, and a subsequently applied sound metallic copper coacting in surmounting and intimate secure relation with said surmounting strata to provide an encapsulating coating adapted to maintain said surface projections intact on said foil surface.

5. The copper foil of claim 4 wherein said external surface is the "as plated" surface of an electrodeposited copper foil.

6. The method of increasing adhesivity of a surface of a copper body to an independent surface which comprises the steps of electrodepositing a strata of copper-copper oxide particles in random clusters to form a plurality of projections from said surface, and subsequently electrodepositing sound metallic copper thereover in surmounting and intimate secure relation to provide an encapsulating coating and to maintain said projections intact thereon.

7. The method of increasing adhesivity of a surface of copper foil to a resinous surface which comprises the steps of electrodepositing a strata of copper-copper oxide particles in random clusters from an aqueous copper sulphate-sulphuric acid plating bath at a current density of from 75 to 250 amperes per square foot for a period of from 5 to 50 seconds, to form a plurality of projections from said surface, and subsequently electrodepositing from an aqueous copper sulphate-sulphuric acid plating bath at a current density of from 20 to 150 amperes per square foot for a period of from 15 to 600 seconds, to provide a sound encapsulating coating and to maintain said projections intact thereon.

8. The method of claim 7 in which the copper foil is electroformed copper foil having an "as plated" surface, and the surface of the copper foil is the "as plated" surface.

9. The method of claim 8 in which the copper foil is rolled foil.

10. In a composite laminar structure, a copper foil having an external surface adhered to a resinous lamina, said surface comprising a copper foil supporting substrate, a surmounting strata of copper-copper oxide particles deposited in random clusters to form a plurality of projections from said substrate and forming an irregular surface thereon, and subsequently applied sound metallic copper coacting in surmounting and intimate secure relation with said surmounting strata.

11. A composite laminar structure in accordance with claim 10 in which the surmounting strata of copper-copper oxide is electrolytic copper-copper oxide.

12. A composite laminar structure in accordance with claim 11 in which the metallic copper is electrolytic copper.

13. A composite laminar structure in accordance with claim 10 in which the resinous lamina comprises a phenolic-nitrile resin.

14. A composite laminar structure in accordance with claim 10 in which the resinous lamina comprises a reinforced epoxy resin.

References Cited by the Examiner

UNITED STATES PATENTS

| | | | |
|---|---|---|---|
| 2,313,456 | 3/1943 | Stareck | 204—23 |
| 2,497,066 | 2/1950 | Korn et al. | 156—151 |
| 2,780,591 | 2/1957 | Frey | 204—23 |
| 2,900,292 | 8/1959 | Coleman et al. | |
| 2,920,990 | 1/1960 | Been et al. | 156—330 |
| 2,997,521 | 8/1961 | Dahlgren | 156—8 |
| 3,038,826 | 6/1962 | Medl | 156—330 |
| 3,220,897 | 11/1965 | Conley et al. | 148—34 |

EARL M. BERGERT, *Primary Examiner.*

R. I. SMITH, M. L. KATZ, *Assistant Examiners.*